(12) United States Patent
Kiesel et al.

(10) Patent No.: US 7,838,330 B1
(45) Date of Patent: Nov. 23, 2010

(54) METHOD OF FIELD-CONTROLLED DIFFUSION AND DEVICES FORMED THEREBY

(75) Inventors: Peter Kiesel, Palo Alto, CA (US); Oliver Schmidt, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/777,045

(22) Filed: May 10, 2010

Related U.S. Application Data

(62) Division of application No. 11/615,331, filed on Dec. 22, 2006, now Pat. No. 7,741,147.

(51) Int. Cl.
  *H01L 21/00* (2006.01)
  *H01L 21/16* (2006.01)
  *H01L 21/331* (2006.01)
  *H01L 21/326* (2006.01)
(52) U.S. Cl. .................. 438/104; 438/357; 438/468; 257/E27.068
(58) Field of Classification Search .................. None
  See application file for complete search history.

(56) References Cited

U.S. PATENT DOCUMENTS 5,597,762 A * 1/1997 Popovici et al. ............. 438/105

2004/0094085 A1 * 5/2004 White et al. ................. 117/4

OTHER PUBLICATIONS

Auret et al., "Electrical characterization of 1.8 MeV proton-bombarded ZnO", Appl. Phys. Lett., vol. 79, No. 19,p. 3074 (Nov. 5, 2001).
Coppa et al., "Gold Schottky contacts on oxygen plasma-treated, n-type ZnP (0001)", Appl. Phys. Lett., vol. 82, No. 3, p. 400 (Jan. 20, 2003).
Fabricius et al., "Ultraviolet detectors in thin sputtered ZnO films", Appl. Optics, vol. 25, No. 16, p. 2764 (Aug. 15, 1986).
Ohta et al., "Fabrication and photoresponse of pn-heterojunction diode composed of transparent oxide semiconductors, p-NiO and n-ZnO", Appl. Phys. Lett., vol. 83, No. 5, p. 1029 (Aug. 4, 2003).
Jeong et al., "Ultraviolet-enhanced photodiode employing n-ZnO/p-Si structure", Appl. Phys. Lett., vol. 83, No. 143, p. 2946 (Oct. 6, 2003).
Liang et al., "ZnO Schottky ultraviolet photodetectors", J. Crystal Growth 225 (2001) 110-113, May 2001.

(Continued)

*Primary Examiner*—Ha Tran T Nguyen
*Assistant Examiner*—Valerie Brown
(74) *Attorney, Agent, or Firm*—Jonathan A. Small

(57) ABSTRACT

A technique for creating high quality Schottky barrier devices in doped (e.g., $Li^+$) crystalline metal oxide (e.g., ZnO) comprises field-controlled diffusion of mobile dopant atoms within the metal oxide crystal lattice. When heated (e.g., above 550 K) in the presence of an electric field (e.g., bias to ground of +/−50 V) the dopant atoms are caused to collect to form an ohmic contact, leaving a depletion region. The size of the depletion region controls the thickness of the Schottky barrier. Metal-semiconductor junction devices such as diodes, photo-diodes, photo-detectors, MESFETs, etc. may thereby be fabricated.

3 Claims, 7 Drawing Sheets

OTHER PUBLICATIONS

Liu et al., "Ultraviolet detectors based on epitaxial ZnO films grown by MOCVD", J. Elec. Materials, vol. 29, No. 1, p. 69, Jan. 2000.

Mead, "Surface barriers on ZnSe and ZnO", Phys. Let. vol. 18, No. 3, p. 218 (Sep. 1, 1965).

Monroy et al., "Wide-bandgap semiconductor ultraviolet photodetectors", Semicond. Sci. Technol., 18 (2003), R33-R51, Mar. 2003.

Neville et al., "Surface barriers on zinc oxide", J. Appl. Phys., vol. 41, No. 9, p. 3795 (Aug. 1970).

Nikitin et al., "Photoelectric phenomena in ZnO:Al-p-Si heterostructures", Semiconductors, vol. 37, No. 11, p. 1291, Nov. 2003.

Nikitin et al., "Oscillations of induced photopleochroism in ZnO/GaAs heterojunctions", Semiconductors, vol. 38, No. 4, p. 393.

Ohashi et al., "Isothermal capacitance transient spectroscopy for deep levels in Co- and Mn-doped ZnO single crystals", J. mater. Res., vol. 17, No. 6, p. 1529 (Jun. 2002).

Ohta et al., "Fabrication and characterization of heteroepitaxial p-n junction diode composed of wide-gap oxide semiconductors p-ZnRh2O4/n-ZnO", Appl. Phys. Lett., vol. 82, No. 5, p. 823 (Feb. 3, 2003).

Orlinskii et al., "Probing the wave function of shallow Li and Na donors in ZnO nanoparticles", Phys. Rev. Lett., vol. 92, No. 4, p. 047603-1 (Jan. 30, 2004).

Polyakov et al., "Electrical characteristics of Au and Ag Schottky contacts on n-ZnO", Appl. Phys. Lett., vol. 83, No. 8, p. 1575 (Aug. 25, 2003).

Sheng et al., "Schottky diode with Ag on (1120) epitaxial ZnO film", Appl. Phys. Lett., vol. 80, No. 12, p. 2132 (Mar. 25, 2002).

Simpson et al., "Characterization of deep levels in zinc oxide", J. Appl. Phys., vol. 63, No. 5, p. 1781 (Mar. 1, 1988).

Slobodchikov et al., "Supression of current by light in p-Si-n+-ZnO-n-Zno-Pd diode structures", Semiconductors, vol. 35, No. 4, p. 464 (2001).

* cited by examiner

METHOD OF FIELD-CONTROLLED DIFFUSION AND DEVICES FORMED THEREBY

CROSS-REFERENCE TO RELATED APPLICATIONS

The present application is a divisional application of copending U.S. application Ser. No. 11/615,331, which is incorporated herein by reference and to which priority is claimed.

STATEMENT REGARDING FEDERALLY SPONSORED RESEARCH AND DEVELOPMENT

This invention was made with government support under AFOSR F49620-02-1-1163 awarded by the Department of the Air Force. The government has certain rights in the invention.

BACKGROUND OF THE INVENTION

1. Field of the Invention

The present invention is related to metal-semiconductor junction devices, and more particularly to devices based on metal-semiconductor junctions such as Schottky diodes, photo-diodes, MESFETs, etc., produced from metal oxides such as ZnO.

2. Description of the Prior Art

Due to its unique material properties, zinc oxide (ZnO) has been and continues to be used in optoelectronic components. For example, ZnO is a semiconductor with a direct band gap of 3.37 eV (368 nm at room temperature). Its transparency for the visible spectrum and conductivity mean that ZnO can be used as a transparent electrode, for example in optoelectronic applications such as light emitting diodes (LEDs), laser diodes, photodiodes, optical displays, etc.

While ZnO may serve as a suitable bulk material for device fabrication, doping is required to actually realize typical semiconductor devices. ZnO can be doped n-type, for example by introduction of Ga or Al as when the material is used as transparent conducting oxide. However, reliable p-doping in ZnO has yet to be demonstrated. Consequently, it has not been possible to form p-junction or p-n junction devices, such as diodes and diode-based devices like LEDs, laser diodes or photodiodes. Also for electronic devices such as bipolar transistors and junction FETs p doping is required.

For certain applications, Schottky diodes (metal-semiconductor junction devices) are used as an alternative to semiconductor-semiconductor junction devices. In addition, Schottky devices enable a number of unique applications, e.g. MESFETs, Schottky photodiodes, etc. However due to the low absolute energy of the conduction and valence band of bulk ZnO, the fabrication of high quality Schottky contacts of ZnO is problematic. Many unconventional fabrication methods have been proposed, however none of them provides a reliable, reproducible and convenient method to fabricate Schottky contacts.

There is little information about ZnO-metal Schottky contacts in the open literature to date. The chemical reactions between the metal and the semiconductor, the surface states, the contaminants, the defects in the surface layer, and the diffusion of the metal into the semiconductor are well known problems in the formation of Schottky contacts. For instance, with Al as the contact metal, ZnO produces significant dissociated cations (Zn) in ZnO because of its strong reaction with anions (O) in ZnO. This results in low barrier height and high leakage current.

To create a Schottky barrier with undoped ZnO, a high work function metal can be applied to the surface of a ZnO crystal. Although it has been shown that Au presents a number of challenges at high temperatures (>340 K), Au has widely been applied to ZnO to form Schottky barriers. Other metals used for the same purpose are Ag and Pd. It has been found that all these reactive metals form relatively high Schottky barriers of 0.6-0.84 eV to the n-type ZnO.

Since high-quality Schottky contacts on ZnO are problematic and reliable p-doping of ZnO has not previously been demonstrated, there has been little work addressing the use of ZnO for UV photodetection, including photoconductors, Schottky barrier photodetectors, metal-semiconductor-metal (MSM) structures, etc. ZnO photoconductors, consisting of two ohmic Al contacts on N-doped ZnO grown by metal-organic vapor phase epitaxy (MOVPE) have been reported. ("Ultraviolet detectors based on Epitaxial ZnO films grown by MOCVD," TMS & IEEE J. Electronic Materials, 27, 69-74 (January 2000), incorporated herein by reference.) At +5 V bias, these devices present a dark current of 450 nA, a responsivity of ~400 A/W and a time response of 1.5 μs. In a similar material, MSM photodiodes formed with interdigitated Ag Schottky contacts present lower leakage current (1 nA at 5 V bias) and better spectral selectivity, but slower time response ("ZnO Schottky ultraviolet photodetectors," J. Crystal Growth, vol. 225, pp. 110-113 (May 2001), which is incorporated herein by reference). The fast response characteristic of this structure is followed by a slow photocurrent decay, which lasts for about 5 ms. This slow component is attributed to the oxygen adsorption at the surface and grain boundaries.

In an effort to overcome the difficulty forming p-n junction devices, another approach is to use a second semiconductor material on the p-side of the device while using ZnO on the n side. Heterojunction diodes have been produced in this way, but these devices exhibit substantial material quality issues due to the lattice and thermal mismatch during growth. Nevertheless, efforts continue with regard to studying and developing the photo response properties of these ZnO based heterojunctions.

For example, Jeong et al. in "Ultraviolet-enhanced photo-diode employing n-ZnO/p-Si structure," Appl. Phys. Lett. 83, 2946 (2003), which is incorporated herein by reference, reported on the photoelectric properties of a heterostructure n-ZnO/p-Si photodiode which detect UV photons in the depleted n-ZnO and simultaneously detects visible photons in the depleted p-Si by employing two related photoelectric mechanisms. The I-V measurements obtained while the photodiodes are exposed to radiation in a wavelength range of 310 to 650 nm showed a linear increase in photocurrent with reverse bias. In the visible range, the photocurrent rose rapidly with bias but saturated beyond a critical voltage. According to this reference, the diodes exhibited high responsivities of 0.5 and 0.3 NW for UV (310-nm) and red (650-nm) photons, respectively, under a 30 V bias with a minimum near 380 nm which corresponds to the band gap of ZnO.

However, there remain both a desire and a need in the art for techniques for producing a high quality Schottky contact device based on ZnO (or more generally in metal oxides), particularly one with low leakage current and desired optical and I-V properties.

SUMMARY OF THE INVENTION

Accordingly, the present invention is directed to systems and methods for providing high-quality Schottky contacts in metal oxide base material system, such as ZnO. A fabrication process and the design of Schottky-based diodes, photodetectors, metal-semiconductor field effect transistors (MESFETs), and similar devices on bulk and epitaxial metal oxide is provided.

According to one aspect of the present invention, the electrical properties of a doped metal oxide base material may be modified by a combination of electrical and thermal conditions leading to migration of mobile dopant atoms, a process we refer to herein as a "field-controlled diffusion process." A dopant atom is understood, for the purpose of the present description, as being a deep acceptor/donor or shallow acceptor/donor, which may be added during production of a bulk or epitaxial semiconductor or post-production, and may be added intentionally or as a part of the semiconductor fabrication process as a contaminant or defect. The fabrication of a Schottky diode is based on this field-controlled diffusion process. The starting material is a metal oxide such as bulk or epitaxial ZnO into which a dopant (e.g., $Li^+$ ions) has been incorporated (e.g., by ion implantation or thermally assisted diffusion process). Depending on the incorporation state (e.g., interstitial or substitutional at a lattice site) the doping ions act as a donor or deep acceptor. Electric field-controlled diffusion at an elevated temperature allows a controlled movement of the interstitially incorporated dopants whereas the substitutional incorporated dopants remain localized. Depending on the polarity and strength of the electric field one can create larger or smaller depletion regions underneath contacts and thereby form and control the thickness of a Schottky barrier. Accordingly, high-quality Schottky contacts, MOSFETs, Schottky-diodes, etc. with low dark current can be produced.

According to another aspect of the present invention, the field-controlled diffusion is reversible and can be applied many times. Therefore, a processes is provided for revitalization of devices after degradation or damage, or otherwise to adjust device characteristics post-fabrication.

In the example above, Li provided in ZnO an immobile deep acceptor resulting in a highly resistive material and a mobile shallow donor. In general, the dopant atoms may but are not required to be amphoteric. That is, the present invention is equally operable should the dopant atoms not form (immobile) deep acceptors. Either way, it is the carrier concentration being altered by migration of the dopant atoms that is critical. For example, we could begin with a bulk metal oxide semiconductor such as ZnO that is highly resistive due to a deep donor, and incorporate a mobile p-dopant to provide mobile acceptors (holes). An electric field may be employed in the semiconductor at an elevated temperate environment to accumulate the acceptors in a selected region. The mobile dopant provides holes such that regions where the mobile dopant is dominant are p-doped. In the regions where the material is highly doped an ohmic contact can be formed, whereas in a region with absence of the dopant the material is dominated by the deep donor which enables a Schottky contact. (In these examples it will be appreciated that the carrier and dopant types, p- or n-, may be exchanged with the other. That is, a high resistive p-type substrate and mobile n-type dopant.)

These aspects may be obtained by a method in which the device properties can be adjusted by a combination of electrical and thermal conditions leading to migration of mobile dopant atoms.

The above is a summary of a number of the unique aspects, features, and advantages of the present invention. However, this summary is not exhaustive. Thus, these and other aspects, features, and advantages of the present invention will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION OF THE INVENTION

The field-controlled diffusion process is described below for Li$^+$ incorporated in ZnO. This description is based on observations of Hall measurements on ZnO bulk samples. We have observed that as-formed Li-doped ZnO appears highly resistive. We have concluded that a highly resistive surface region, caused by ion depletion near the surface of the ZnO may be the source of the high resistivity. Our observations can be explained by making the following assumptions:

- The ZnO bulk crystal has a n-type background doping in the order of $10^{17}$ cm$^{-3}$
- The presence of Li is causing acceptor-type (Li—Zn substitution) and donor-type (Li interstitial) defects. E.g., an acceptor concentration of $2\times10^{17}$ cm$^{-3}$ and a donator concentration of $1.5\times10^{17}$ cm$^{-3}$ would result in an average hole concentration of $5\times10^{16}$ cm$^{-3}$.
- There exists a Li-donor (Li interstitial) depletion region close to the surface. This is causing a high-resistive layer between evaporated Ti/Au contacts and the low resistive bulk material.

We have developed a technique to overcome the high resistivity and enable fabrication of ohmic contacts to this material. The same technique can also be used to control the thickness of the depletion region and enable high quality Schottky barriers in this material system.

According to one embodiment of the present invention, a high voltage (e.g., +/−50-100V) is applied between two points on a structure of crystalline ZnO at an elevated temperature (>550 K). The electric field may be established between two contacts (e.g., 5 mm apart) on the surface of the metal oxide body, the body may be placed in an external field or by other means. A process of selectively diffusing interstitial Li atoms (Li has a lower diffusion barrier than LiZn) is thus initiated. The positively charged Li interstitials are attracted by the grounded or negatively biased contact. This destroys the depletion region and creates an ohmic region at that contact. At the positively charged contact the Li ions are repelled, causing a larger depletion region and therefore a thicker Schottky barrier. We have also determined that this procedure is reversible. The benefits of this process and its reversibility are discussed further below.

Figure 1:
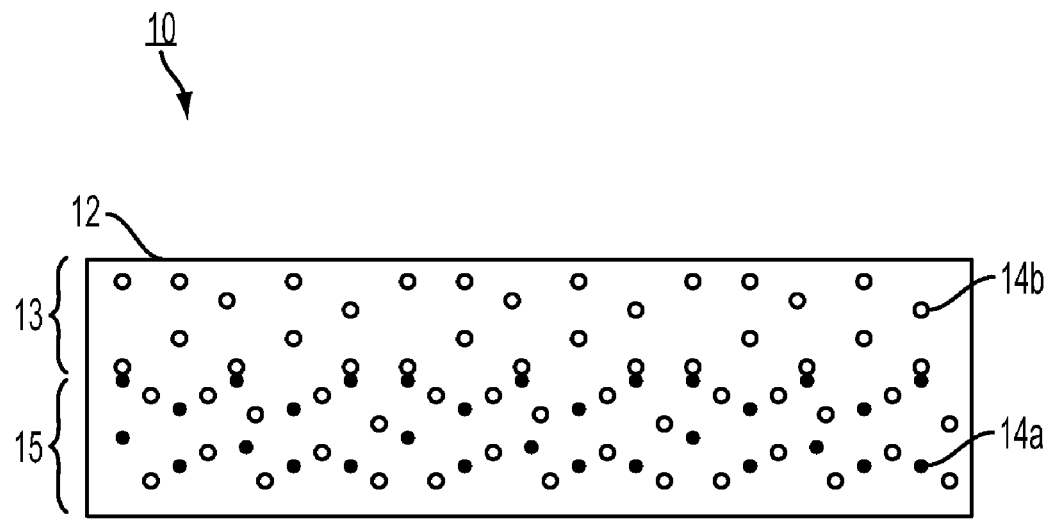
FIG. 1 illustrates a metal oxide structure prior to the process of being fabricated into a high quality Schottky-barrier device or a high quality ohmic contact according to an embodiment of the present invention.

With reference to FIG. 1, a device 10 in the process of being fabricated into a high quality Schottky-barrier device or a high quality ohmic contact is illustrated. Device 10 begins with a crystalline metal oxide material 12, either as a bulk substrate or epitaxially formed on a suitable substrate (not shown). ZnO is a desirable initial metal oxide material due to its band gap, conductivity, and optical properties. Dopant atoms 14a, 14b are introduced into metal oxide material 12. The desired properties of at least one of the dopant atoms 14a, 14b include low molecular weight and small size in order to permit mobility within the metal oxide crystalline structure. They must be either n-type or p-type ions. With these attributes in mind, we have identified Li$^+$ as a good candidate material for dopant atoms 14a, 14b. Dopant atoms 14a, 14b may be introduced during formation or growth of metal oxide material 12, or subsequently introduced by implantation, thermal diffusion or other technique. In the process of introduction, dopant atoms may be interstitial, 14a, or substitutional 14b within the metal oxide material crystal structure. In this way, there are two types of dopants present: mobile, such as interstitial dopant atoms 14a, and fixed/immobile, such as substitutional dopant atoms 14b. In its as-formed (or as-doped) state, metal oxide material 12 will have dopant atoms 14a, 14b generally randomly distributed throughout. In general, dopants 14a, 14b do not have to be amphoteric, interstitial or substitutional. Rather, what is required is that one dopant (14b) is causing an immobile deep donor or deep acceptor such that the material appears high resistive and a second dopant (14a) that is providing a mobile shallow acceptor or shallow donor, respectively.

As illustrated in FIG. 1 the upper region (layer) 13 close to surface of oxide material 12 is depleted of the dopant atoms (14a) with the higher mobility, as compared to the region 15. This is a typical staring condition of a doped oxide material structure due to a temperature step during the fabrication of the oxide material and/or doping, causing an out-diffusion of atoms 14a. Note that the dopants 14b are Li on Zn sites (deep acceptors, producing high resistivity). In the bulk material 12 the deep acceptors 14b are overcompensated by shallow donors 14a (the interstitials) causing a net n-type background.

In one example of the above process, ZnO bulk material was employed. Li dopant atoms were incorporated after the growth of the ZnO by annealing of the material in a Li-bearing atmosphere (LiOH). Annealing temperatures were in the range of 500° C. and 900° C. The Ti/Au contacts were thermally evaporated onto the sample through a shadow mask according to procedures well known in the art. Contact thicknesses were 20 nm of Ti and 100-200 nm of Au.

Device 10 at this stage will exhibit a fairly uniform, relatively high electrical resistivity. The material has a homogeneous bulk n-type background doping but the bulk properties are difficult to measure since they are screened by the high resistive surface layer 13. Due to the high resistive surface layer 13 it is difficult to create ohmic contacts on the bulk material. We have also found, however, that the electrical properties of the bulk material may be modified by a combination of electrical and thermal conditions leading to migration of the mobile interstitial dopant atoms 14a, a process we refer to as a "field-controlled diffusion process".

According to our field-controlled diffusion process, if the temperature of metal oxide material 12 is raised sufficiently high, and a sufficiently strong electric field is established between two points on metal oxide material 12 at the elevated temperature, Schottky-like I-V characteristics are obtained. It appears that, at the elevated temperature and in the presence of the electric field, the dopant atoms tend to migrate toward one of the field points creating there an Ohmic contact and revealing the Schottky contact at the other field point where the mobile atoms migrate away from the contact (and so increasing the Schottky depletion region).

Figure 2:
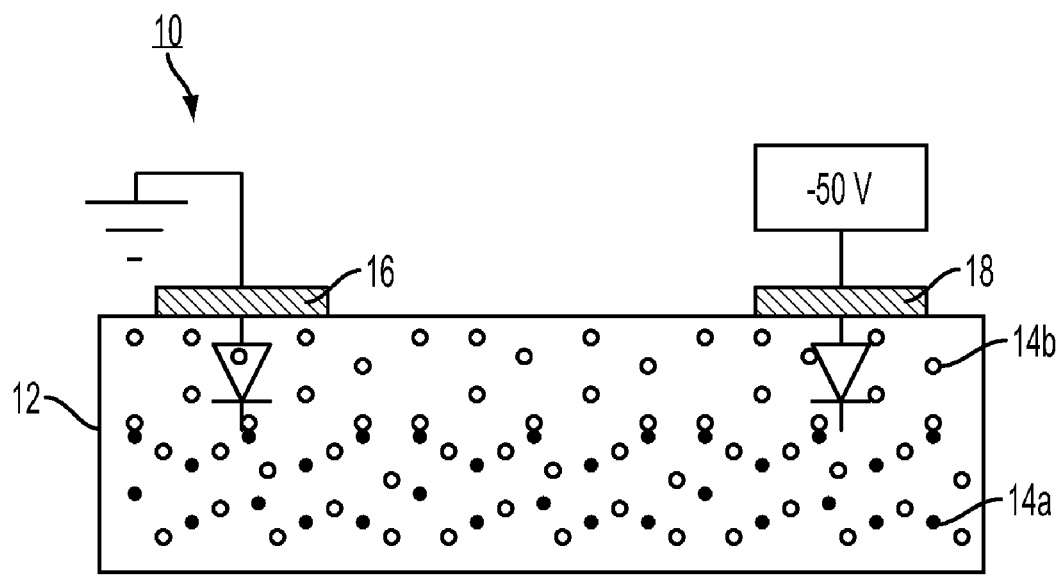
FIG. 2 illustrates the metal oxide structure of FIG. 1 disposed for fabrication into a high quality Schottky-barrier device or a high quality ohmic contact, below the field-diffusion temperature elevated temperature.
Figure 3:
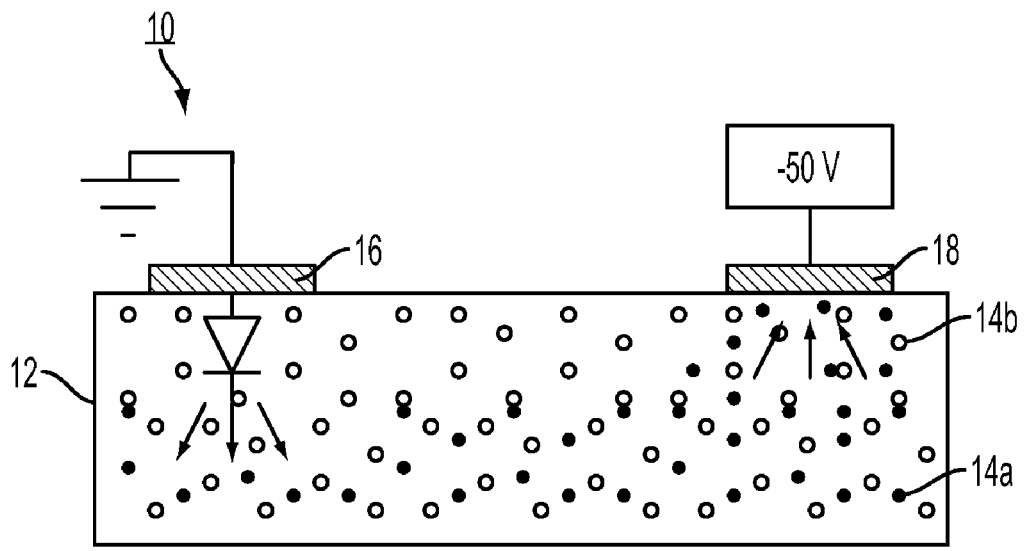
FIG. 3 illustrates the metal oxide structure of FIGS. 1 and 2 in the process of being fabricated into a high quality Schottky-barrier device or a high quality ohmic contact, at the field-diffusion temperature, according to an embodiment of the present invention.

For example, according to one embodiment of the present invention shown in FIG. 2, first and second contacts 16, 18 are formed approximately 5 mm apart on a surface of metal oxide material 12. When a voltage bias of −50 volts is applied to one of the contacts, for example second contact 18, at room temperature (without any pre-treatment of the device) poor current across the contacts is obtained. However, when the arrangement is repeated while the device 10 is at an elevated temperature of ~550 K, we note a migration of dopant atoms 14a toward second contact 18, as illustrated in FIG. 3. When the voltage bias is removed and the device 10 returns to room temperature, dopant atoms 14a remain in the locations to which they migrated. The positively charged interstitial dopant atoms are attracted by the negatively biased contact. This destroys the depletion region immediately thereunder, and creates an ohmic contact. At the ground contact the dopant atoms are repelled, causing a larger depletion region, creating a thicker Schottky barrier thereunder.

We also note that when a voltage bias of +50 is applied to second contact 18 while the device 10 is at a temperature at or above approximately 550 K, the polarity of the Schottky device reverses, due to migration of the dopant atoms away from second contact 18 and toward first contact 16. An ohmic region is formed under first contact 16, and a Schottky barrier is formed under second contact 18. This attribute of our process means that device characteristics may be controlled, and even reversed, post-fabrication. Modifying the characteristics of the device may, in fact, be done many times. For example, the field-controlled diffusion processes may be employed for revitalization of devices after degradation or (radiation) damage.

Figure 4:
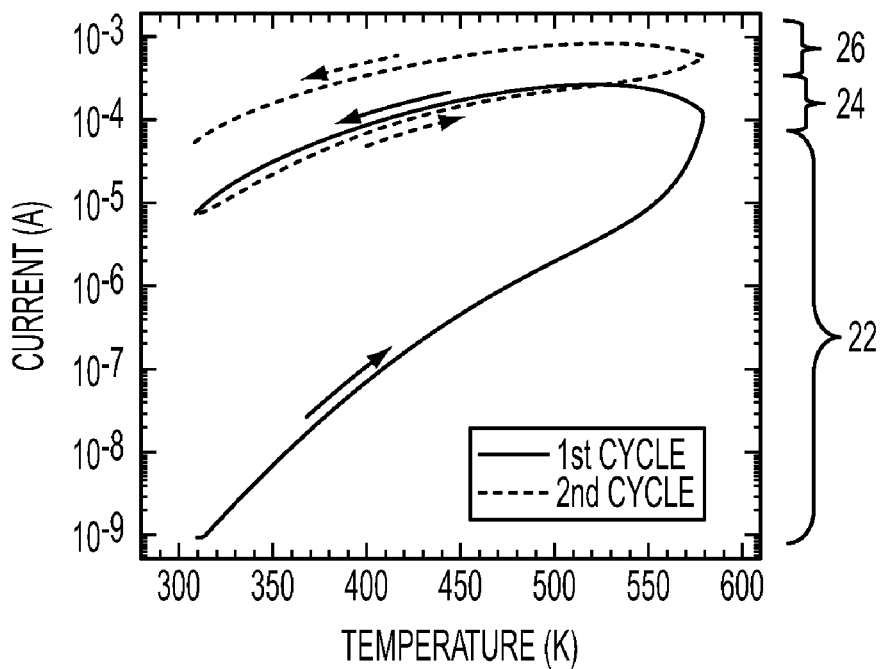
FIG. 4 is a plot of the temperature versus current performance for the metal oxide structure of FIG. 3 in the process of being fabricated into a high quality Schottky-barrier device or a high quality ohmic contact according to an embodiment of the present invention.

With reference to FIG. 4, the field-controlled diffusion process for creating an Ohmic contact is illustrated as a function of temperature versus current. Note that the current through this contact is initially (before the field-controlled diffusion process) in the 1 to 10 nA range, and rises to 0.1 to 1 mA after the diffusion process at a voltage of 50 V. The increased Schottky depletion region underneath the other contact is causing low reverse currents (discussed further with regard to FIG. 5, below). It will be seen that as the temperature rises, the current between contacts increases (region 22), and after a point, approximately 550 K in this example, the device becomes significantly more conductive (region 24) and far less dependent upon temperature. Note that the "kink" around 550 K in the $1^{st}$ cycle curve indicates the onset of the field-controlled diffusion. In the example shown in FIG. 4, a second field-controlled diffusion process was performed on the sample, and again this effect was seen (region 26), although with much less dramatic effect than the first processing. This indicates that the field induced diffusion process was not completed after the first temperature cycle. Further field-controlled diffusion steps did not significantly alter the device conductivity, indicating a significantly complete migration of the mobile dopant atoms.

Figure 5:
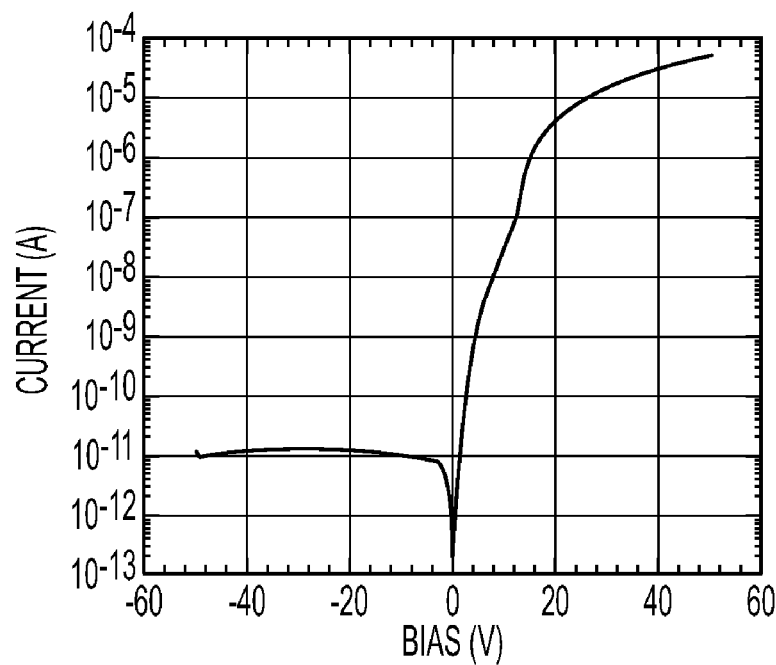
FIG. 5 is an illustration of the room-temperature voltage-current characteristics for a device produced by the field-controlled diffusion process according to an embodiment of the present invention.
Figure 6:
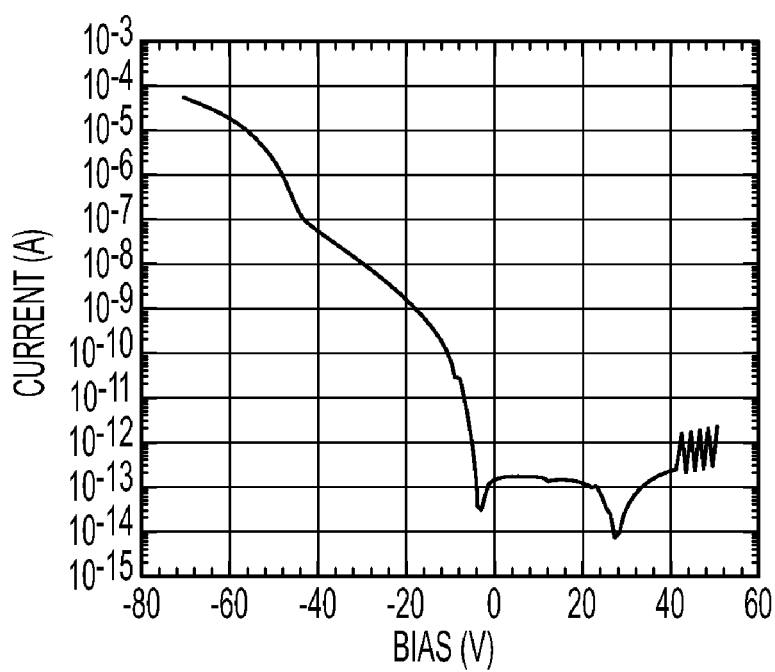
FIG. 6 is an illustration of the room temperature I-V characteristic curve for the device of FIG. 5 after a field-controlled diffusion process resulting in a reversal of the Schottky and ohmic regions according to an embodiment of the present invention.

FIG. 5 is an illustration of the room-temperature voltage-current characteristics for a device produced by the field-controlled diffusion process according to the present invention. As can be seen, the device performs as would be expected of a forward and reverse biased Schottky device. Likewise, FIG. 6 is an illustration of the room temperature I-V characteristic curve for the device of FIG. 5 after a field-controlled diffusion process resulting in a reversal of the Schottky and ohmic regions. That is, the device whose performance is illustrated in FIG. 6 is reversely biased compared to that of FIG. 5. Again, the device performs as would be expected of a forward or reverse biased Schottky device, which demonstrates the reversibility of the field-controlled diffusion process. Note that the poor performance of the Schottky characteristics in forward bias is mainly caused by the series resistance between the two test contacts which were 5 mm apart.

Figure 7:
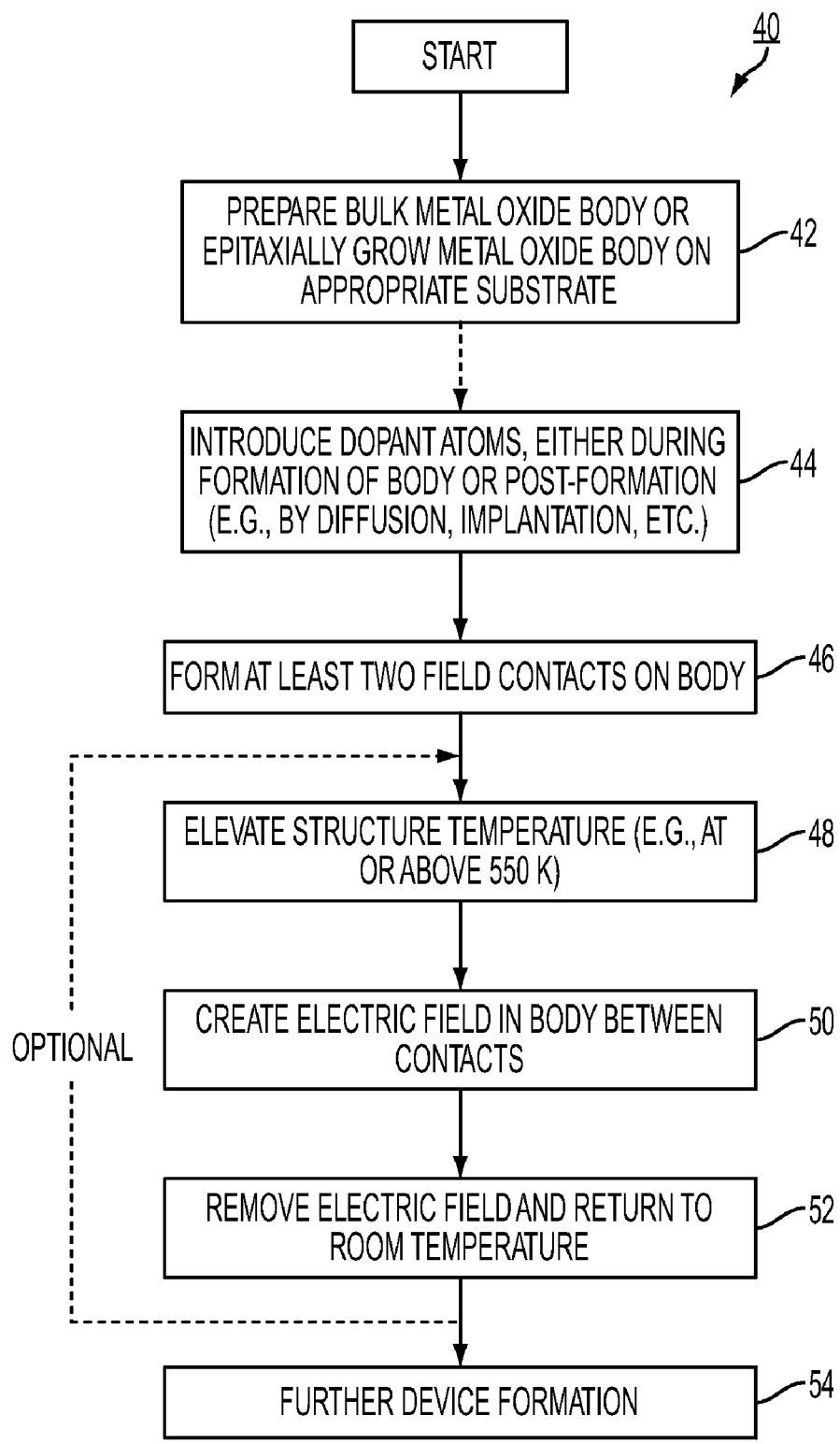
FIG. 7 is a flow chart of the steps of a general process of field-controlled diffusion according to an embodiment of the present invention.

Steps of the general process 40 of field-controlled diffusion according to the present invention are shown and described with reference to the flow chart of FIG. 7. A metal oxide body is prepared, possibly including growth thereof, at step 42. Dopant atoms are introduced at step 44, either during formation of the body at step 42 (i.e., formation and doping done in a single step, hence the dashed line between steps 42 and 44) or subsequent to forming the body (e.g., by diffusion, implantation, etc.) At least two contacts are next formed on body, at step 46. The structure so formed is then heated at step 48. While the appropriate temperature to permit dopant atom mobility will depend on the choice of metal oxide material forming the body as well as the choice of dopant atom material, we have found that for ZnO and Li dopants, heating the structure to at least 550 K is sufficient. At step 50, an electric field is created between the at least two contacts. While the appropriate field strength to cause migration of the dopant atoms will depend on the choice of metal oxide material forming the body as well as the choice of dopant atom material, we have found that a field formed between a first contact at ground and a second contact at +/−50 volts is sufficient. (It will be noted that the order of steps 48 and 50 may be reversed without changing the result of the process.) Finally, the electric field is removed and the device returned to room temperature at step 52 to effectively lock the migrated dopant atoms into place. Additional steps required to form specific devices may then be performed at step 54, as described further below (noting that returning the device to the field-controlled diffusion temperature and electric field conditions may alter the Schottky barrier(s) established in the preceding steps). It will be appreciated that some or all of the processing underlying step 54 may precede steps 48 through 52 in appropriate applications.

The foregoing describes the generalized formation and operation of a Schottky barrier within a metal oxide material. While according to the present disclosure, ZnO is a system of particular interest, a Schottky barrier may be formed by field-controlled diffusion in a variety of metal oxide material systems. Furthermore, while the foregoing has described Li as a suitable dopant material within a ZnO base material, other dopant materials may be employed, as will be appreciated by one skilled in the art. Finally, devices according to the present invention described below include Schottky diodes, photodetectors, MESFETs, etc., many other devices employing Schottky barriers may benefit from formation according to the present invention, and accordingly the present invention shall not be interpreted as being limited to the fabrication of the devices explicitly discussed below.

Figure 8:
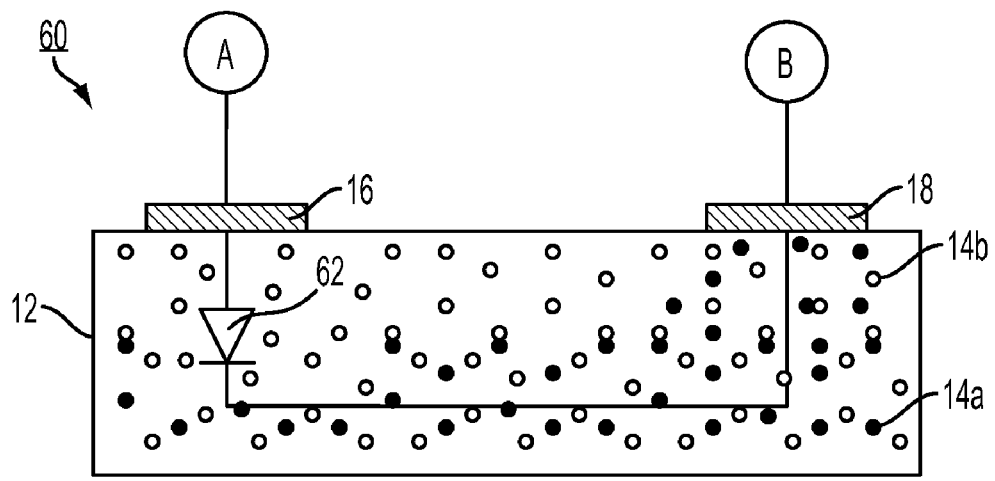
FIG. 8 is an illustration of a Schottky diode fabricated by a field-controlled diffusion process according to an embodiment of the present invention.

The field-controlled diffusion process of the present invention enables the formation of a number of useful devices. A first such device 60, a Schottky diode, is illustrated in FIG. 8. As previously described, a metal oxide body 12, such as ZnO is formed to include dopant atoms 14a and 14b, such as Li interstitials (n-type dopant) and Li on Zn site (deep p-type) therein, and a field-controlled diffusion process is performed, resulting in a relatively larger population of n-type dopant atoms under contact 18, which creates an ohmic contact, and a relatively larger depletion region under contact 16 which creates a relatively thicker metal-semiconductor Schottky barrier. Accordingly, between terminals A and B a Schottky diode 62 is effectively formed. Of course, the contacts can be applied at any side of the crystal, e.g. the ohmic contact could be formed on the backside of the bulk or epi crystal.

As mentioned, care must be taken that the operating conditions of the device formed are not at or above the field-controlled diffusion conditions used to form the ohmic contact and depletion regions above.

Figure 9:
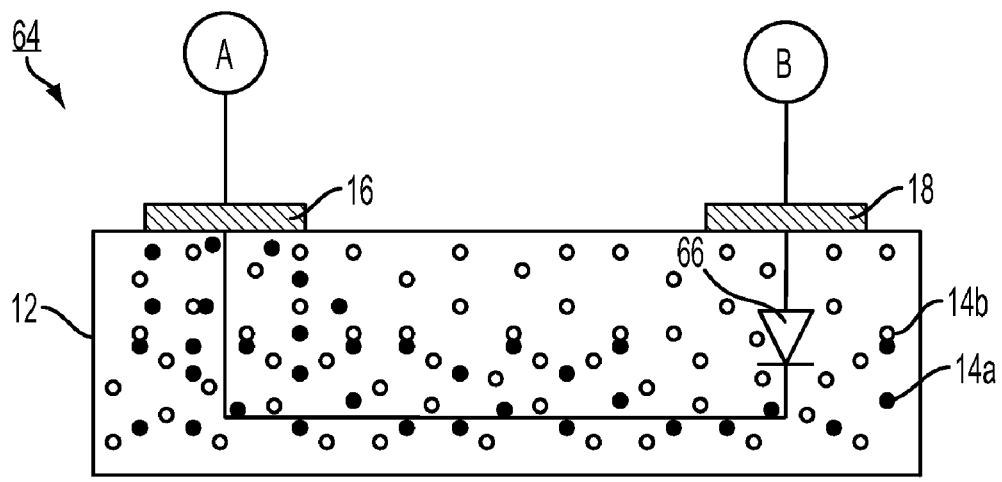
FIG. 9 is an illustration of the reversal of polarity of the Schottky diode post-formation by a subsequent field-controlled diffusion process according to an embodiment of the present invention.

However, in certain circumstances, it may be desirable to refresh (e.g., repair damage), alter (e.g., tune performance parameters), or entirely switch (e.g., change polarity) performance aspects of the device post-formation. For example, the field-controlled diffusion process may be repeated following formation of the device shown in FIG. 8 to reestablish the depletion and ohmic contact regions which form the Schottky diode 62. Furthermore, as illustrated in FIG. 9, the polarity of the Schottky diode may be reversed post-formation by a subsequent field-controlled diffusion process. Beginning with the device shown in FIG. 8, a voltage of −50 V is applied to terminal B while terminal A is connected to ground. (Alternatively, a voltage of +50 V is applied to terminal A, while terminal B is connected to ground, or a voltage of +50 V is applied to terminal A, while a voltage of −50V is applied to terminal B.) The temperature of the device is raised above the field-controlled diffusion temperature (e.g., above 550 K).

Assuming p-type dopant atoms are employed, those dopant atoms are thereby accumulated in the region of first contact 16 forming an ohmic contact, and a depletion region is formed under second contact 18, effectively forming a Schottky diode 66 having a polarity revered as compared to that of diode 62 shown in FIG. 8. This reversal of the ohmic and Schottky contacts is itself reversible, and the process can be repeated multiple times for a given device.

Figure 10:
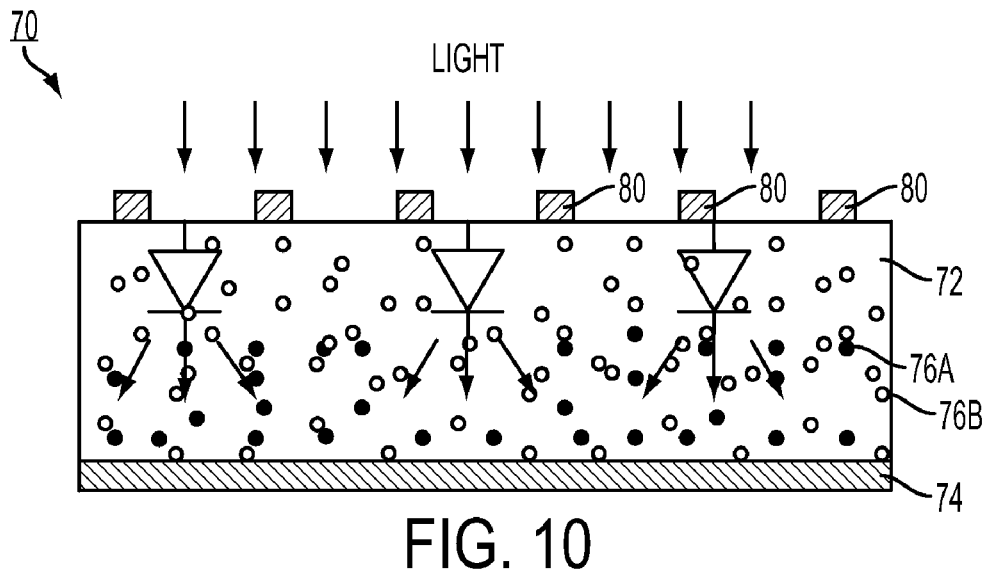
FIGS. 10 and 11 are illustrations of a Schottky-based photo-detector fabricated by a field-controlled diffusion process according to an embodiment of the present invention.
Figure 11:
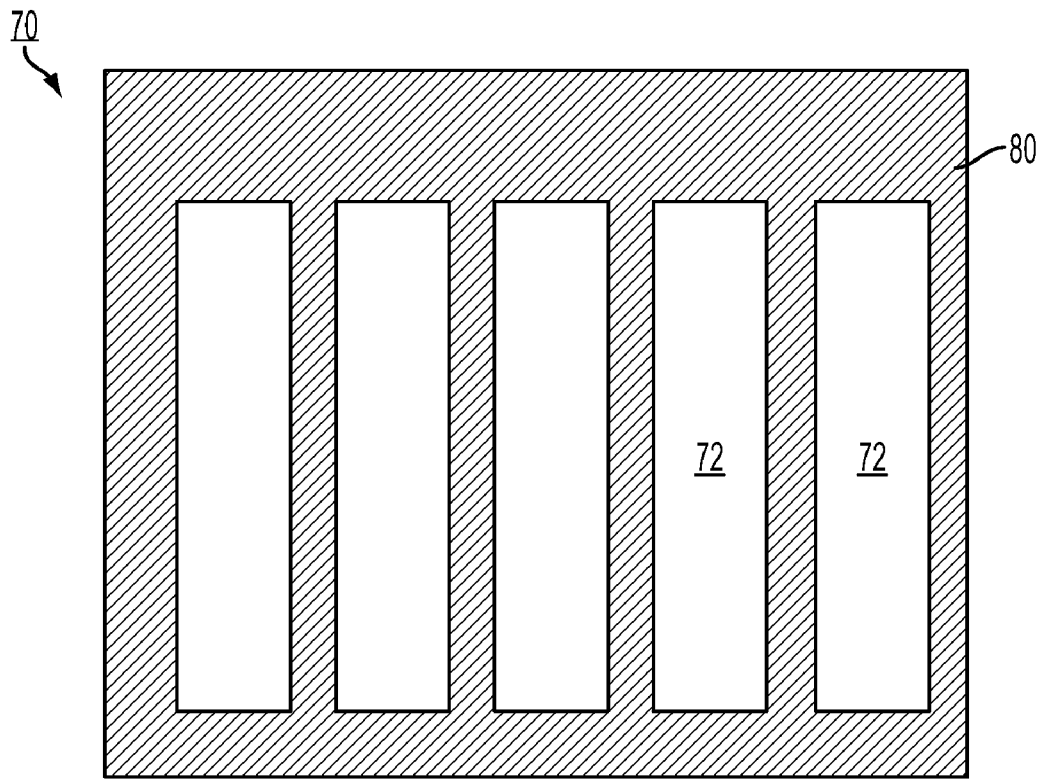

A second device, a Schottky-based photo-detector 70, is illustrated in FIGS. 10 and 11. According to an aspect of the present invention, Ohmic contact 74 is formed on the backside of ZnO body 72. Body 72 has mobile n-type dopants 76*a* and immobile deep acceptors 76*b* therein. An array 80 of finger contacts is formed on the surface of body 72 opposite contact 74. Initially, a field-controlled diffusion process is performed such that a bias, such as −50 V, is applied to array 80, while contact 74 is, for example, connected to ground (or, as with any of the embodiments herein, connected to a positive potential such as +50 V). Device 70 is raised to above about 550 K, causing the n-type Li$^+$ dopant atoms to migrate further toward ground and contact 74. With the temperature returned to room temperature, and the bias removed from array 80, a device is formed having a depletion region proximate array 80, and an Ohmic region proximate contact 74. A Schottky barrier is thus developed between array 80 and contact 74. When exposed to light, photons are absorbed within the ZnO body 72 (for ZnO, absorption will be in the UV and blue wavelengths) creating electron-hole pairs. The electrical field within the depletion region of the Schottky contact can separate the electron-hole pairs and cause a photocurrent through the Schottky contact. A photodiode may thus be formed. By tuning the thickness of the (Schottky) depletion region under array 80 a photodetector with a controlled space charge region and optimized capacitance can be designed.

The array of finger contacts 80 serve to form one connection to the photodiode so formed. The gaps between the contacts 80 permit light to be incident on the body 72 when the contacts 80 themselves are opaque to the wavelength of interest. However, the finger contact may be formed of a transparent conductor, such as ITO, or may be replaced by a transparent layer of conductive material, again such as ITO or a semitransparent thin metal film. These selections depend on the application of the photodetector.

The thickness of the Schottky depletion region defines the absorption volume. The thickness of the depletion region can be altered by applying a voltage and it is influenced by the carrier concentration within the semiconductor. Further, the relative position of the work function of the metal compared to the Fermi level in the semiconductor influences the thickness of the depletion region. E.g. for a carrier concentration of $10^{16}$ cm$^{-3}$ the depletion region is typically in the order of 1 micron. If the carrier concentration is increased the depletion region size decreases. Finally, if the depletion region becomes very thin, electrons can tunnel through the energetic barrier between metal and semiconductor bulk such that Schottky contacts become Ohmic.

Figure 12:
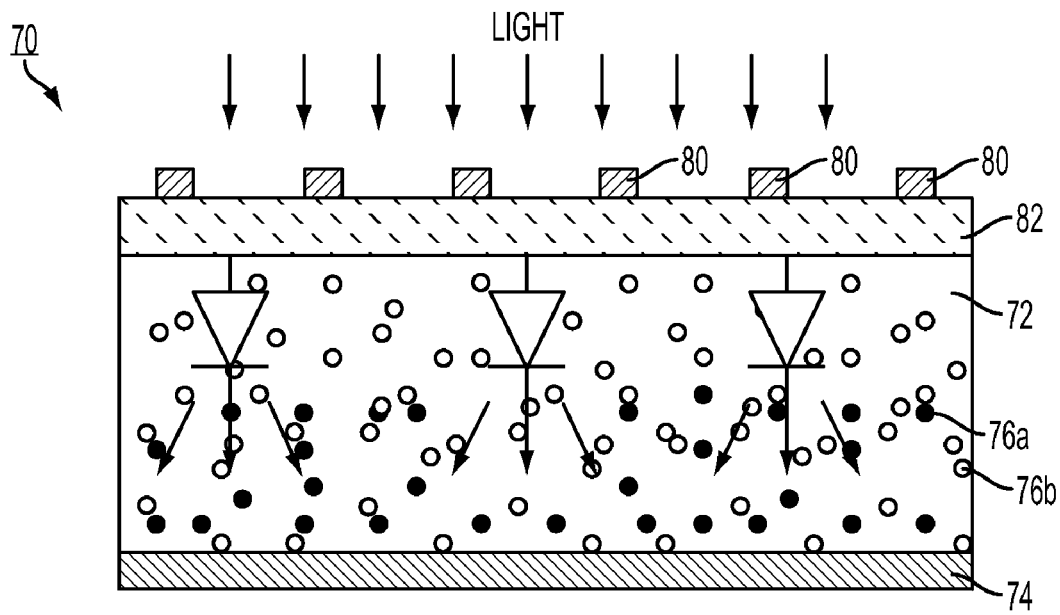
FIG. 12 is an illustration of an arrangement for the control of the depth of photon absorption within a metal oxide structure by use of a transparent semiconducting layer over the metal oxide structure according to an embodiment of the present invention.

In some applications it may be desirable to control the depth of photon absorption within ZnO body 72. One method of accomplishing this is to form a non-absorptive layer 82, which is transparent within bandwidth of interest, between array 80 and body 72, such as illustrated in FIG. 12. Non-absorptive layer 82 is created on the surface of the structure thereby eliminating (or at least significantly reducing) carrier recombination at the surface of body 72 (a well known loss mechanism of photodetectors) that would not contribute to the photocurrent. Non-absorptive layer 82 is typically a semiconductor that has a larger band-gap than the underlying material forming body 72. One example would be MgZnO which has a larger band-gap than ZnO. The depletion region of a Schottky contact (where the charge separation of photogenerated electron-hole pairs takes place) is typically around 1 or 2 microns deep depending on the carrier concentration within the semiconductor. The large-band-gap semiconductor layer should be comparatively thin, e.g., 10-100 nm, as it reduces the effective absorption volumes.

Figure 13:
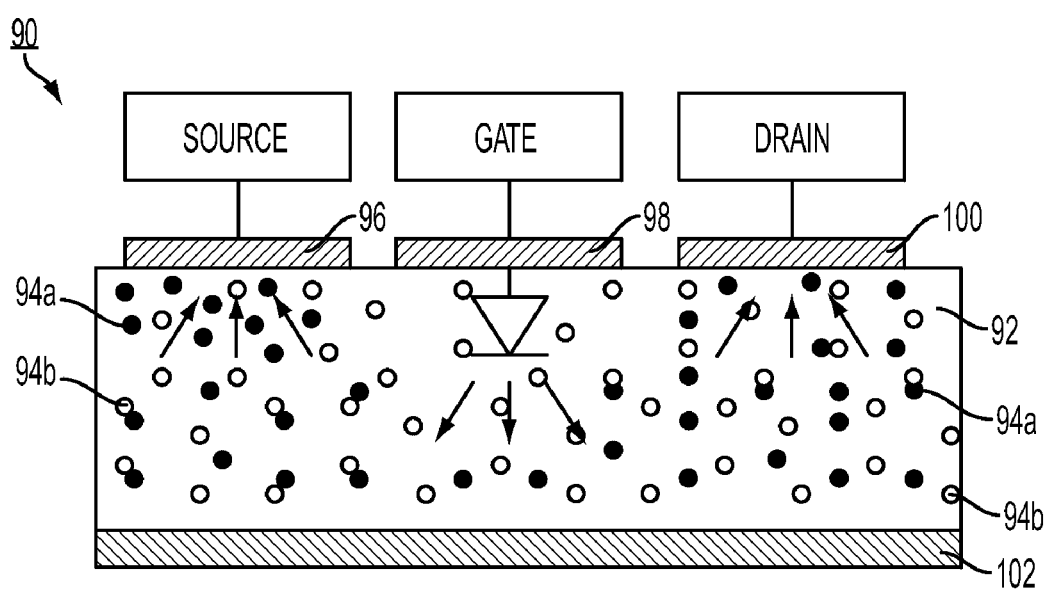
FIG. 13 is an illustration of a Schottky-based metal-semiconductor field effect transistor (MESFET) fabricated by a field-controlled diffusion process according to an embodiment of the present invention.

A third device based on the present invention, a Schottky-based metal-semiconductor field effect transistor (MESFET) 90 is illustrated in FIG. 13. According to this aspect of the present invention, a ZnO body 92 is formed to include Li$^+$ dopant atoms (interstitial and substitutional) 94*a*, 94*b* therein. Three contacts 96, 98, 100 respectively, are formed on the surface of body 92. Body 92 is formed on a highly resistive substrate 102 opposite contacts 96, 98, 100 which does not allow currents to run from contact 96 to contact 100. Field-controlled diffusion is performed such that the Li+ dopant ions are attracted to the regions below contacts 96 and 100. Dopant atoms under contact 98 may be in their as-processed state (generally a depletion region directly under contact 98), or contact 98 may be connected to a potential such that a field is created causing dopant atoms to migrate away from the region below contact 98. In this way, the region immediately below contacts 96 and 100 form Ohmic contacts and the region immediately below contact 98 forms a Schottky contact.

In essence, this process produces a structure in which contact 96 may serve as a source, contact 98 may serve as a gate, and contact 100 may serve as a drain for a MESFET. If the depletion region below the gate (98) is small, a current can run from source (96) to drain (98) along the highly conductive regions in which the mobile Li+ donor atoms accumulate. If a voltage is applied to the gate, the depletion region may be made to extend the entire depth of body 92 under the gate (98) such that no current can run from source (96) to drain (100).

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the invention in any way. Rather, the foregoing detailed description provides those of ordinary skill in the art with a convenient guide for implementation of the invention, and contemplates that various changes in the functions and arrangements of the described embodiments may be made without departing from the spirit and scope of the invention defined by the claims thereto.

What is claimed is:

1. A method of fabricating a metal-semiconductor Schottky-barrier transistor structure, comprising:
   providing a metal oxide structure having mobile p-type dopant ions introduced therein;
   forming first, second, and third contact structures on the surface of said metal oxide structure wherein the second contact is located physically between, but spaced apart from, the first and third contact structures;
   elevating the temperature of said metal oxide structure;
   creating an electric field within a first region and a third region of said metal oxide structure by establishing a voltage potential between the first and second contact structures and the second and third contact structures, respectively, said electric field present while said metal oxide structure is at said elevated temperature, such that said mobile p-type dopant ions are caused to selectively migrate from a second region of said metal oxide structure which is substantially outside of said electric field toward said first and third regions of said metal oxide structure proximate said first and third contact structure; and removing said electric field and lowering the temperature of the metal oxide structure such that the migrated dopant ions remain in the locations to which they have migrated;

whereby at least a portion of said second region becomes one portion of a Schottky barrier, and further whereby exposure of the structure to light in order to cause the mobile p-type dopant atoms to migrate is not performed.

2. The method of claim 1 wherein the step of creating an electric field in the metal oxide structure while the structure is at an elevated temperature results in the formation at the interface between the contact structures and the metal oxide structure at the first and third regions Ohmic contacts, and at the second region a Schottky contact.

3. The method of claim 1 wherein the first and third region provides a source region and a drain region of the transistor, respectively, and the second region provides a gate region for the transistor.

* * * * *